United States Patent
Matsuyama et al.

(10) Patent No.: US 6,812,622 B2
(45) Date of Patent: Nov. 2, 2004

(54) PIEZOELECTRIC VIBRATOR

(75) Inventors: Masaru Matsuyama, Tochigi (JP); Satoshi Shimizu, Tochigi (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/280,812

(22) Filed: Oct. 25, 2002

(65) Prior Publication Data

US 2003/0168943 A1 Sep. 11, 2003

(30) Foreign Application Priority Data

Oct. 29, 2001 (JP) ........................................ 2001-330267

(51) Int. Cl.[7] .......................................... H01L 41/053
(52) U.S. Cl. ........................ 310/344; 310/348; 310/354
(58) Field of Search ................................ 310/344, 348, 310/353, 354, 351

(56) References Cited

U.S. PATENT DOCUMENTS

| | | | | |
|---|---|---|---|---|
| 3,980,911 A | * | 9/1976 | English | 310/348 |
| 4,362,961 A | * | 12/1982 | Gerber | 310/370 |
| 4,464,598 A | * | 8/1984 | Besson et al. | 310/344 |
| 4,992,693 A | * | 2/1991 | Kishi et al. | 310/348 |
| 6,111,338 A | * | 8/2000 | Otsuchi et al. | 310/352 |
| 6,541,897 B2 | * | 4/2003 | Endoh | 310/344 |
| 6,545,392 B2 | * | 4/2003 | Kawauchi et al. | 310/344 |
| 6,590,315 B2 | * | 7/2003 | Beaver | 310/348 |

* cited by examiner

Primary Examiner—Thomas M. Dougherty
(74) Attorney, Agent, or Firm—Adams & Wilks

(57) ABSTRACT

A piezoelectric vibrator has a piezoelectric vibrating piece having a base portion, a free end, and an intermediate portion disposed therebetween. Each of a pair of covers has a main surface and at least two recesses formed in the main surface. The covers are connected together so that the recesses of the covers form a hermetically sealed cavity into which the piezoelectric vibrating piece of the piezoelectric vibrating plate extends in a state in which the piezoelectric vibrating piece is capable of undergoing oscillating movement. The recesses of each of the covers extend to different depths from the main surface thereof so that during oscillating movement of the piezoelectric vibrating piece, the free end of the piezoelectric vibrating piece is prevented from contacting any one of the covers by contact between the intermediate portion of the piezoelectric vibrating piece and the main surface of the one cover.

26 Claims, 2 Drawing Sheets

PIEZOELECTRIC VIBRATOR

BACKGROUND OF THE INVENTION

1. Field of the Invention

The Present invention relates to a surface mounting-type piezoelectric vibrator.

2. Background Information

A piezoelectric vibrator in which a vibrating portion and a frame are formed so as to be integral with each other is held at a frame portion between covers as shown in FIG. 6 has heretofore been known. In a piezoelectric vibrator of such a construction, covers 10, 20 have a recessed shape, and an inner surface (bottom surface of each of recessed portions) of the covers is generally made of a single flat surface (Refer to JP-A-5-199056).

Since each of the recessed portions on inner side of the covers in a related structure is thus made of a single flat surface, a free end 35 of a vibrating portion 30 impinges in some cases as shown in FIG. 6 upon one of inner surfaces 15, 25 of the covers 10, 20 when the vibrator falls to cause the vibrating portion to be bent due to an impact imparted at the mentioned time to the vibrating plate. When a specially strong impact is imparted to the vibrating plate, the free end impinges upon the inner surface of a cover strongly, so that the free end of the vibrating portion chips off. This causes a frequency constituting one of the important characteristics of the vibrator to be varied greatly in some cases. Incidentally, in a tuning fork quartz oscillator for timepieces, the standards of frequency deviation are about 10 to 20 ppm. On the other hand, when a chip occurs on a free end of a vibrating portion of the oscillator as mentioned previously, the frequency varies by not lower than several hundred ppm in some cases, this posing a big problem.

In addition, in order to solve such a problem as mentioned above, a deep and large space is provided on an inner side of the inner surfaces of the covers so that these inner surfaces are separated from the vibrating portion for the purpose of substantially preventing the free end of the vibrating portion from impinging upon the inner surface of a cover. Therefore, the thickness of the covers tends to increase, so that it becomes difficult to deal with a problem of the reduction, which is now strongly demanded, of the thickness of the vibrator.

SUMMARY OF THE INVENTION

In view of these circumstances, the present invention has been made so that a structure of a piezoelectric vibrator capable of preventing the occurrence of breakage ascribed to an impact imparted to a vibrating portion is attained without increasing a total thickness of the vibrator. To provide such a structure, the invention has covers, which are used as a case for the piezoelectric vibrator, provided with inner surfaces having at least two-stage recesses. In this structure, the collision of a free end of a piezoelectric vibrator with an inner surface of the case can be prevented by increasing the depth of the two-stage recesses from the side of a base portion of a piezoelectric vibrating plate toward that of the free end section thereof, and by providing the portions of the inner surface of the case which is on the upper and lower sides with respect to the direction of the thickness of the free end section of the vibrating portion with deeper recesses extending from the part of the inner surface of the case which corresponds to a lengthwise intermediate section of the vibrating portion of the piezoelectric vibrating plate to the part of the same inner surface which is beyond the free end of the vibrating portion.

The depth of first recesses constituting shallower portions of the two-stage recesses accounts for 2% to 25% of the thickness of the covers, and the depth of second recesses constituting deeper portions of the two-stage recesses accounts for 25% to 60% of the thickness of the covers. A difference in depth occurring on boundary sections between the first recesses and second recesses is set so that stepped sections of the recesses receive an intermediate section of the vibrating portion which is bent due to an impact imparted to the vibrator. When the stepped sections are formed, in the case of a vibrating plate fixed at one end thereof, in positions away from the fixed sections thereof by a distance corresponding to 40% to 80% of a length of the vibrating plate measured from the fixed section thereof to the free end thereof, excellent results are obtained.

According to such a method, the intermediate section of the vibrating portion impinges upon the depth-different sections between the first recess and second recess even when the vibrator falls to cause the vibrating portion to be bent due to an impact imparted to the piezoelectric vibrating plate, so that a further bend of the vibrating portion is prevented. Therefore, the free end of the vibrating portion does not impinge upon the inner surfaces of the covers, i.e., the chipping of the free end of the vibrating portion can be prevented.

DETAILED DESCRIPTION OF THE PREFERRED EMBODIMENTS

The present invention is adapted to prevent a free end of a vibrating portion of a piezoelectric vibrator from being chipped off when the piezoelectric vibrator falls to cause an impact to be imparted to the vibrating portion, by forming a two-stage flat surface on the inner side of each of covers used as a case.

Embodiments of the Invention are Described Below
(Embodiment 1)

Figure 1:
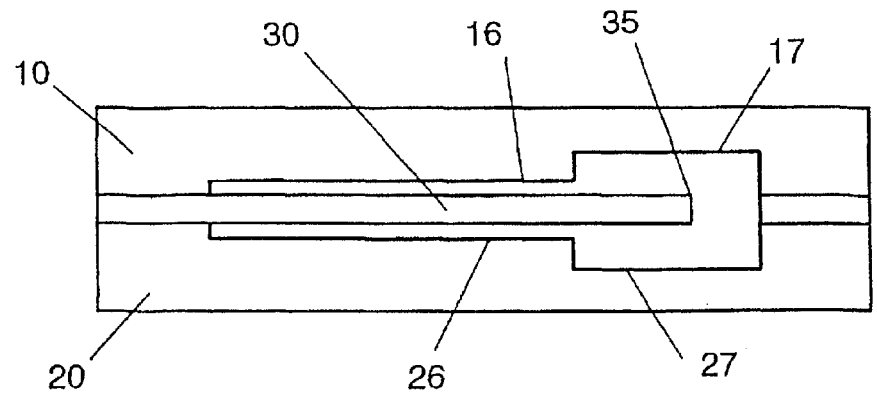
FIG. 1 is a sectional view showing an embodiment of the piezoelectric vibrator according to the present invention.

A case for a surface-mounting type piezoelectric vibrator will be described with reference to the drawings. FIG. 1 is a sectional view showing an embodiment 1 of the present invention. A vibrating piece or portion 30 of a piezoelectric vibrating plate is hermetically or air-tightly sealed with covers 10 and 20 in a state in which the vibrating portion 30 is capable of undergoing oscillating movement. The cover 10 is provided with a first recess 16 and a second recess 17. Similarly, the cover 20 is provided with a first recess 26 and a second recess 27. The recesses 16,17 and 26, 27 define a cavity into which the vibrating portion 30 extends when the covers 10,20 are connected together.

Figure 2:
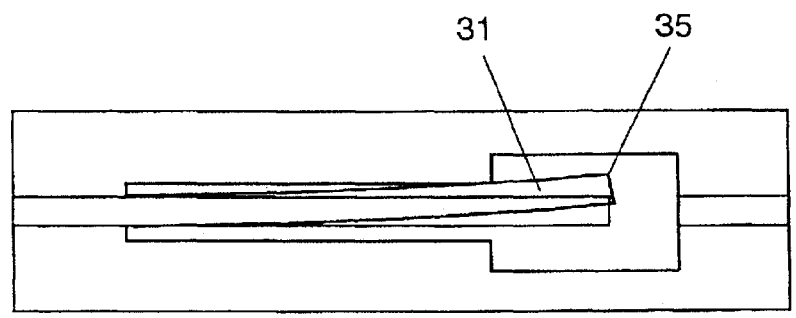
FIG. 2 illustrates an operation of the embodiment of the present invention.

FIG. 2 illustrates an operation of the embodiment 1 of the present invention. When a front end portion 31 of the vibrating portion 30 is bent due to an impact imparted to the piezoelectric vibrating plate, an intermediate portion or section of the vibrating portion 30 contacts or collides with a stepped portion or section at a boundary between first recesses 16, 26 or second recesses 17, 27, and further bending of the vibrating portion is prevented. Thus, the contacting structure between the intermediate section of the vibrating portion 30 and the stepped section at the boundary between the first recesses 16,26 or the second recesses 17,27 defines preventing means for preventing contact between the free end 35 of the vibrating portion 30 and inner surfaces of the covers 10,20. Accordingly, a free end 35 of the vibrating portion 30 does not collide with inner surfaces of the covers 10,20. Namely, chipping of the free end of the vibrating portion can be prevented. Regarding the sizes of each part of the vibrator according to this embodiment, the vibrating portion is a tuning fork type vibrating portion which is 2 to 4 mm in length and 80 μm to 150 μm in thickness, and the first recesses 16, 26 and second recesses 17, 27 of the covers 10,20 are 8 μm to 100 μm and 50 to 200 μm in depth respectively. The advantage according to the present invention is, of course, effective to, for example, a small-thickness vibrator, which is other than the tuning fork type vibrator, such as an AT cut thickness sliding mode vibrator.

In the piezoelectric plate fixed by the covers 10, 20 in this embodiment, the vibrating portion 30 and a frame type portion surrounding a circumference of the vibrating portion are formed so as to be integral with each other at a base end section of the vibrating portion. It is also possible to form the covers 10, 20 out of glass, and make anodic connection to the piezoelectric vibrating plate via a metal film provided on the frame type portion of the piezoelectric vibrating plate.

The piezoelectric vibrating plate has on both side surfaces thereof exciting electrode films for operating the piezoelectric vibrating portion.

(Embodiment 2)

Figure 3:
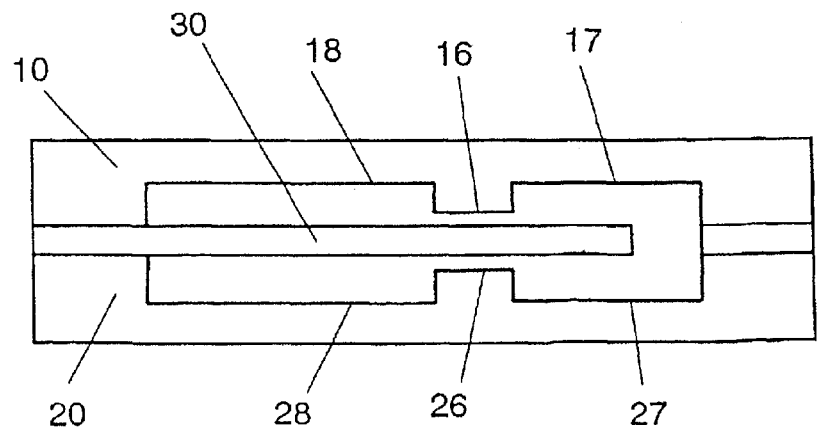
FIG. 3 is a sectional view showing another embodiment of the piezoelectric vibrator according to the present invention.

FIG. 3 is a sectional view showing another embodiment 2 of the present invention. This embodiment constitutes an, example having third recesses 18, 28 on a fixed end side of a vibrating portion, and has the same effect as the embodiment 1. Although the embodiment 2 seems to be structurally complicated, the depth of third recesses and second recesses is equal, and this embodiment is identical with the first embodiment in that two-stage flat surfaces are provided on the inner side of covers.

(Embodiment 3)

Figure 4:
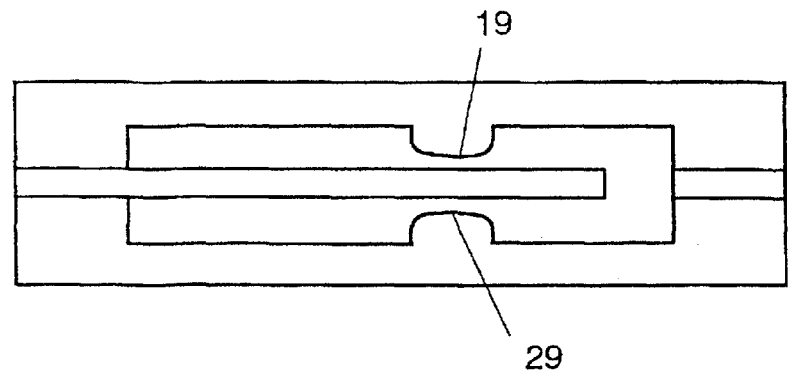
FIG. 4 is a sectional view showing still another embodiment of the piezoelectric vibrator according to the present invention.

FIG. 4 is a sectional view showing still another embodiment 3 of the present invention. This embodiment constitutes an example in which slightly rounded projections 19, 29 are provided instead of such first recesses 16, 26 as in the embodiment 2. When a certain stepped portion-forming method, such as a sintering method is used, first and second recesses are not formed by accurately flat surfaces but by such slightly rounded surfaces as are shown in the embodiment 3. Even such a structure can prevent the bend of the vibrating portion, and the chipping of a free end 35.

(Embodiment 4)

Figure 5:
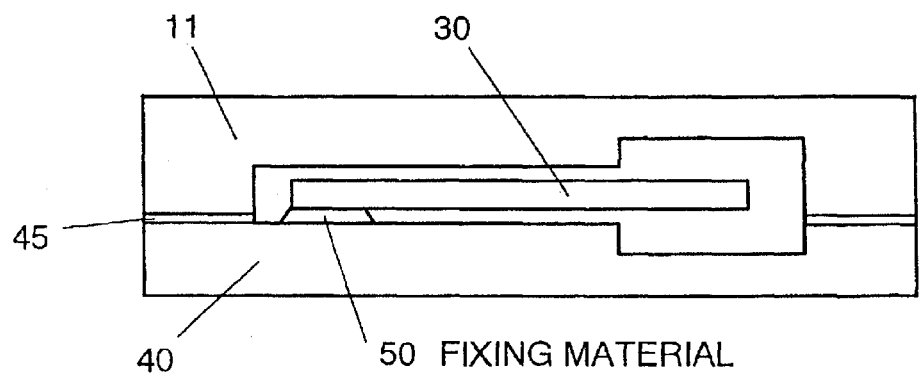
FIG. 5 is a sectional view showing a further embodiment of the piezoelectric vibrator according to the present invention.
Figure 6:
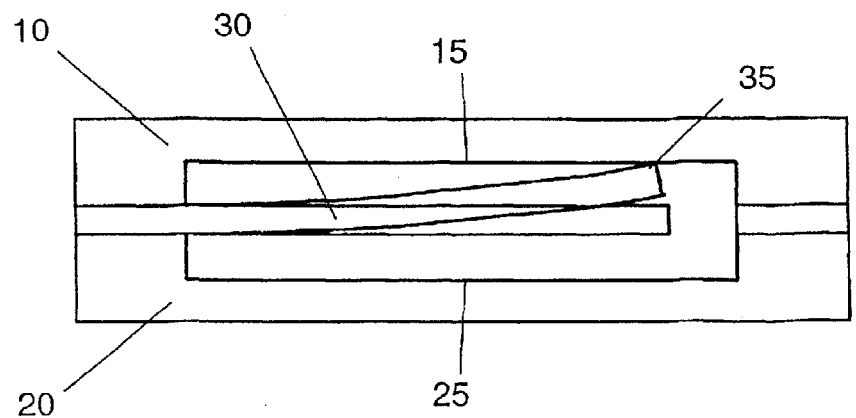
FIG. 6 is a sectional view showing a related art piezoelectric vibrator.

FIG. 5 is a sectional view showing an embodiment 4 of the present invention. This embodiment constitutes an example in which the present invention is applied to a vibrator of a structure in which a vibrating piece or portion 30 is mounted on a base plate 40, which is formed out of a ceramic material and the like, by a fixing material 50 with the base plate 40 and a cover 11 air-tightly sealing the vibrating portion 30 with a sealing material 45. When the first and second recesses shaped according to the present invention are thus provided even in a vibrator formed by such base plate and cover, i.e. members of different materials and structures, the chipping of a free end 35 of the vibrator can be prevented.

When the present invention is executed as described above, the collision of the free end of the vibrating portion with the inner surface of the case can be prevented even when the vibrator falls to cause an impact to be imparted to the vibrating portion, and a large variation of a frequency constituting one of the important characteristics of a vibrator can also be prevented.

Moreover, covers having a deep and large space become unnecessary, so that a total thickness of the covers can be reduced. This enables the reduction of the thickness, which has recently been demanded strongly, of a vibrator to be dealt with.

What is claimed is:

1. A piezoelectric vibrator comprising:

a base plate having a main surface and a recess formed in the main surface;

a piezoelectric vibrating piece having an end portion integrally connected to the main surface of the base plate; and a cover having a main surface and a plurality of recesses formed in the main surface, the main surface of the cover being connected to the main surface of the base plate so that the main surface and the corresponding recess of the base plate and the recesses of the cover form a hermetically sealed cavity containing the piezoelectric vibrating piece in a state in which the piezoelectric vibrating piece is capable of undergoing oscillating movement.

2. A piezoelectric vibrator comprising:

a piezoelectric vibrating plate comprised of a frame and a piezoelectric vibrating piece having a base portion, a free end opposite the base portion, and an intermediate portion disposed between the base portion and the free end, the frame being connected with the base portion and surrounding the piezoelectric vibration piece; and a pair of covers each having a main surface and at least two recesses formed in the main surface, the covers being connected together so that the recesses of the covers form a hermetically sealed cavity into which the piezoelectric vibrating piece of the piezoelectric vibrating plate extends in a state in which the piezoelectric vibrating piece is capable of undergoing oscillating movement, the recesses of each of the covers extending to different depths from the main surface thereof so that during oscillating movement of the piezoelectric vibrating piece, the free end of the piezoelectric vibrating piece is prevented from contacting any one of the covers by contact between the intermediate portion of the piezoelectric vibrating piece and the main surface of the one cover.

3. A piezoelectric vibrator according to claim 2; wherein the covers are formed of glass.

4. A piezoelectric vibrator according to claim 1; wherein the main surface of the cover comprises a first main surface, the cover having a second main surface opposite the first main surface and a thickness extending from the first main surface to the second main surface; and wherein the plurality of recesses formed in the first main surface of the cover comprises a first recess extending from the first main surface at a first depth corresponding to 22% to 25% of the thickness of the cover and a second recess extending from the first main surface at a second depth greater than the first depth and corresponding to 25% to 60% of the thickness of the cover.

5. A piezoelectric vibrator according to claim 1; wherein the plurality of recesses formed in the main surface of the cover comprises a first recess extending from the main surface at a first depth and a second recess extending from the main surface at a second depth greater than the first depth.

6. A piezoelectric vibrator according to claim 5; wherein the first recess has a base portion and a side portion; and wherein the second recess has a base portion and a side portion contiguous with the base portion of the first recess to form a first stepped portion of the cavity.

7. A piezoelectric vibrator according to claim 6; wherein the recess formed in the main surface of the base plate has a base portion and a side portion contiguous with a portion of the main surface of the base plate to form a second stepped portion of the cavity.

8. A piezoelectric vibrator according to claim 7; wherein the piezoelectric vibrating piece has a free end opposite the end portion and an intermediate portion disposed between the end portion and the free end for contacting any one of the first and second stepped portions of the cavity during oscillating movement of the piezoelectric vibrating piece to prevent contact between the free end of the piezoelectric vibrating piece and the base portion of the corresponding one of the second recess formed in the main surface of the cover and the recess formed in the main surface of the base plate.

9. A piezoelectric vibrator according to claim 1; wherein the recess formed in the main surface of the base plate is disposed opposite to and confronts the second recess formed in the main surface of the cover.

10. A piezoelectric vibrator according to claim 9; wherein the piezoelectric vibrating piece has a free end opposite the end portion and disposed between the recess formed in the main surface of the base plate and the second recess formed in the main surface of the cover.

11. A piezoelectric vibrator according to claim 1; wherein the plurality of recesses formed in the main surface of the cover comprises a first recess extending from the main surface at a first depth and a second recess extending from the main surface at a second depth greater than the first depth, the second recess having a first base portion; and wherein the recess formed in the main surface of the base plate has a second base portion.

12. A piezoelectric vibrator according to claim 11; wherein the piezoelectric vibrating piece has a free end opposite the end portion; and further comprising preventing means for preventing contact between the free end of the piezoelectric vibrating piece and the first and second base portions during oscillating movement of the piezoelectric vibrating piece.

13. A piezoelectric vibrator according to claim 12; when the piezoelectric vibrating piece has an intermediate portion disposed between the end portion and the free end; and wherein the preventing means comprises a stepped portion of each of the base plate and the cover for contacting the intermediate portion of the piezoelectric vibrating piece to prevent contact between the free end of the piezoelectric vibrating piece and the first and second base portions during oscillating movement of the piezoelectric vibrating piece.

14. A piezoelectric vibrator according to claim 1; wherein the piezoelectric vibrating piece has a free end opposite the end portion and an intermediate portion disposed between the end portion and the free end for contacting any one of the base plate and the cover during oscillating movement of the piezoelectric vibrating piece to prevent the free end of the piezoelectric vibrating piece from contacting the corresponding one of the base plate and the cover.

15. A piezoelectric vibrator according to claim 2; further comprising bonding films integrally connecting the covers to respective ones of opposite surfaces of the frame.

16. A piezoelectric vibrator according to claim 2; wherein the main surface of each of the covers comprises a first main surface, each of the covers having a second main surface opposite the first main surface and a thickness extending from the first main surface to the second main surface; and wherein the at least two recesses formed in the first main surface of each of the cover comprise a first recess extending from the first main surface at a first depth corresponding to 22% to 25% of the thickness of the cover and a second recess extending from the first main surface at a second depth greater than the first depth and corresponding to 25% to 60% of the thickness of the cover.

17. A piezoelectric vibrator according to claim 2; wherein the at least two recesses formed in the main surface of each of the covers comprise a first recess and a second recess; and wherein the first and second recesses of one of the covers are disposed opposite to and confront respective ones of the first and second recesses of the other cover.

18. A piezoelectric vibrator according to claim 17; wherein the opposite and confronting first recesses of the covers define a first cavity portion of the cavity having a first height in a thickness direction of the covers; and wherein the opposite and confronting second recesses of the covers define a second cavity portion of the cavity having a second height in a thickness direction of the covers greater than the first height.

19. A piezoelectric vibrator according to claim 18; wherein the free end of the piezoelectric vibrating piece is disposed in the second cavity portion of the cavity.

20. A piezoelectric vibrator according to claim 19; further comprising a pair of stepped portions disposed between the first and second cavity portions of the cavity; and wherein the intermediate portion of the piezoelectric vibrating piece contacts any one of the stepped portions to prevent the free end of the piezoelectric vibrating piece from contacting the covers during oscillating movement of the piezoelectric vibrating piece.

21. A piezoelectric vibrator comprising:
a piezoelectric vibrating plate comprised of a frame and a piezoelectric vibrating piece having a base portion, a free end opposite the base portion, and an intermediate portion disposed between the base portion and the free end, the frame being connected with the base portion and surrounding the piezoelectric vibration piece; and
a pair of covers connected together and forming a hermetically sealed cavity into which the piezoelectric vibrating piece of the piezoelectric vibrating plate extends in a state in which the piezoelectric vibrating piece is capable of undergoing oscillating movement, the cavity having a first cavity portion containing the intermediate portion of the piezoelectric vibrating piece and a second cavity portion containing the free end of the piezoelectric vibrating piece and having a height greater than a height of the first cavity portion in a thickness direction of the covers.

22. A piezoelectric vibrator according to claim 21; wherein the cavity has a third cavity portion contiguous with the first cavity portion but not with the second cavity portion.

23. A piezoelectric vibrator according to claim 21; wherein the piezoelectric vibrating piece extends into the cavity so that during oscillating movement of the piezoelectric vibrating piece, the free end of the piezoelectric vibrating piece is prevented from contacting any one of the covers by contact between the intermediate portion and the one cover.

24. A piezoelectric vibrator comprising:
 a piezoelectric vibrating plate comprised of a frame and a piezoelectric vibrating piece having a base portion, a free end opposite the base portion, and an intermediate portion disposed between the base portion and the free end, the frame being connected with the base portion and surrounding the piezoelectric vibration piece;
 a pair of covers connected together and forming a hermetically sealed cavity into which the piezoelectric vibrating piece of the piezoelectric vibrating plate extends in a state in which the piezoelectric vibrating piece is capable of undergoing oscillating movement; and
 preventing means for preventing the free end of the piezoelectric vibrating piece from contacting the covers during oscillating movement of the piezoelectric vibrating piece.

25. A piezoelectric vibrator according to claim 24; wherein the preventing means comprises a pair of projections extending into the cavity from respective ones of the covers and defining a cavity portion containing the intermediate portion of the piezoelectric vibrating piece so that the intermediate portion contacts the projection of any one of the covers to prevent the free end of the piezoelectric vibrating piece from contacting the one cover during oscillating movement of the piezoelectric vibrating piece.

26. A piezoelectric vibrator according to claim 25; wherein the pair of projections are disposed in opposite and confronting relation to one another.

* * * * *